US009805808B2

(12) United States Patent
Shimura

(10) Patent No.: US 9,805,808 B2
(45) Date of Patent: Oct. 31, 2017

(54) SEMICONDUCTOR DEVICE AND METHOD FOR OPERATING THE SAME

(71) Applicant: TOSHIBA MEMORY CORPORATION, Minato-ku (JP)

(72) Inventor: Yasuhiro Shimura, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/200,183

(22) Filed: Jul. 1, 2016

(65) Prior Publication Data

US 2017/0236591 A1 Aug. 17, 2017

Related U.S. Application Data

(60) Provisional application No. 62/296,202, filed on Feb. 17, 2016.

(51) Int. Cl.

*G11C 16/26* (2006.01)
*G11C 16/24* (2006.01)
*G11C 16/34* (2006.01)

(52) U.S. Cl.

CPC .............. *G11C 16/26* (2013.01); *G11C 16/24* (2013.01); *G11C 16/3445* (2013.01); *G11C 16/3459* (2013.01)

(58) Field of Classification Search

CPC ..... G11C 16/0483; G11C 16/00–16/04; G11C 16/0408; G11C 16/06; G11C 16/08; G11C 16/14; G11C 16/16; G11C 16/24–16/26

See application file for complete search history.

(56) References Cited

U.S. PATENT DOCUMENTS 7,929,344 B2 4/2011 Maejima
8,068,362 B2 11/2011 Ota
8,520,444 B2 * 8/2013 Cho .................... G11C 11/5642 365/185.17
8,830,753 B2 * 9/2014 Kim .................. G11C 16/0483 365/185.08

(Continued)

FOREIGN PATENT DOCUMENTS

JP 2009-230777 10/2009
JP 2010-277683 A 12/2010

(Continued)

*Primary Examiner* — Hien Nguyen
(74) *Attorney, Agent, or Firm* — Oblon, McClelland, Maier & Neustadt, L.L.P.

(57) ABSTRACT

According to one embodiment, a semiconductor device includes a memory cell array, word lines, bit lines, a source line, and a circuit controlling a read operation of the information. The memory cell array includes a plurality of memory strings. The plurality of memory strings includes a plurality of memory cells connected in series. The plurality of memory cells connected to one of the word lines is included in a unit of a page. Each bit line is connected to one end of the plurality of memory strings. The source line is connected to one other end of the plurality of memory strings. The circuit applies a pre-charge voltage to the plurality of bit lines in the read operation and changes the pre-charge voltage according to at least one of a number of used pages, a position of the page, or a number of programmed memory cells.

19 Claims, 16 Drawing Sheets

(56) References Cited

U.S. PATENT DOCUMENTS

| | | | | |
|---|---|---|---|---|
| 8,908,456 | B2 * | 12/2014 | Park | G11C 7/12 365/185.18 |
| 9,502,124 | B2 * | 11/2016 | Park | G11C 16/26 |
| 2007/0133291 | A1 | 6/2007 | Fukuda et al. | |
| 2010/0302856 | A1 | 12/2010 | Ahn | |
| 2011/0032760 | A1 | 2/2011 | Takagiwa | |
| 2012/0155186 | A1 * | 6/2012 | Chokan | G11C 16/3459 365/185.22 |
| 2015/0078094 | A1 | 3/2015 | Nagashima | |
| 2015/0262691 | A1 * | 9/2015 | Kamata | G11C 16/26 365/185.22 |

FOREIGN PATENT DOCUMENTS

| | | |
|---|---|---|
| JP | 2011-40124 A | 2/2011 |
| JP | 2011-40166 | 2/2011 |
| JP | 2011-40166 A | 2/2011 |
| JP | 2015-56198 | 3/2015 |

* cited by examiner

SEMICONDUCTOR DEVICE AND METHOD FOR OPERATING THE SAME

CROSS-REFERENCE TO RELATED APPLICATIONS

This application is based upon and claims the benefit of priority from U.S. Provisional Patent Application 62/296,202 filed on Feb. 17, 2016; the entire contents of which are incorporated herein by reference.

FIELD

Embodiments described herein relate generally to a semiconductor device and a method for operating the same.

BACKGROUND

A memory device having a three-dimensional structure has been proposed in which memory holes are made in a stacked body in which multiple electrode layers are stacked, and a charge storage film and an electrode layer are provided to extend in the stacking direction of the stacked body inside the memory hole. The memory device includes multiple memory cells connected in series between a drain-side selection transistor and a source-side selection transistor. The electrode layers of the stacked body are gate electrodes of the drain-side selection transistor, the source-side selection transistor, and the memory cells. In the memory device having the three-dimensional structure, there are circumstances in which the ON current (hereinbelow, called the cell current) fluctuates easily according to the data pattern programmed to the memory cells, e.g., the number of used pages, inside one block. It is desirable to suppress the fluctuation of the cell current.

DETAILED DESCRIPTION

Figure 1:
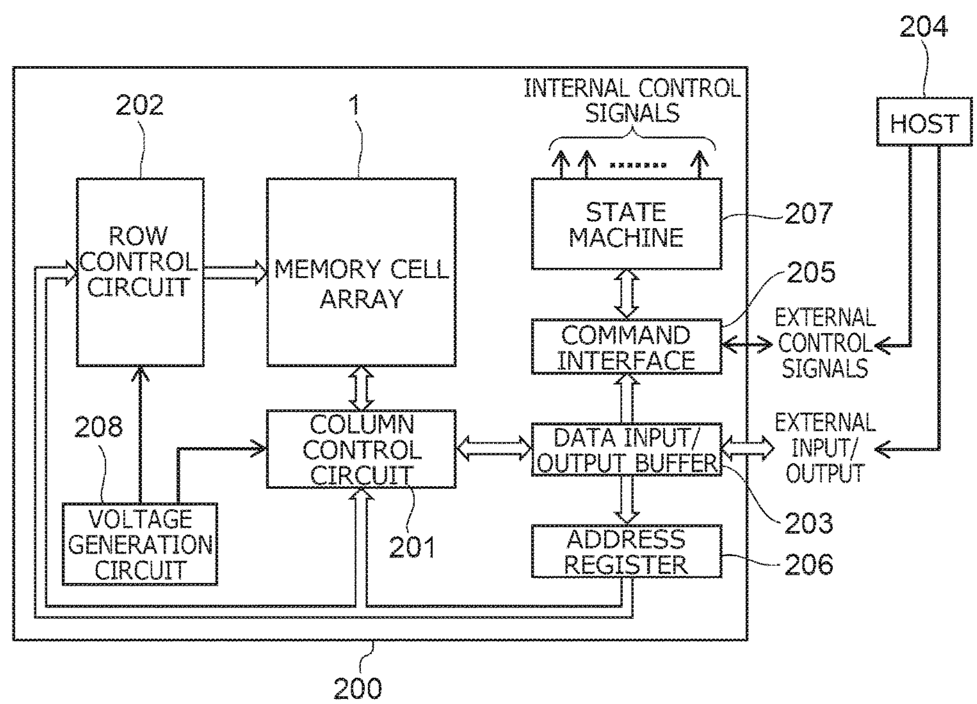
FIG. 1 is a schematic block diagram of a semiconductor device of a first embodiment.

According to one embodiment, a semiconductor device includes a memory cell array, a plurality of word lines, a plurality of bit lines, a source line, and a circuit controlling a read operation of the information. The memory cell array includes a plurality of memory strings. The plurality of memory strings includes a plurality of memory cells connected in series. Each of the plurality of memory cells stores information according to a threshold voltage. Each word line is connected to a gate electrode of the plurality of memory cells. The plurality of memory cells connected to one of the word lines is included in a unit of a page. Each bit line is connected to one end of the plurality of memory strings. The source line is connected to one other end of the plurality of memory strings. The circuit applies a pre-charge voltage to the plurality of bit lines in the read operation and changes the pre-charge voltage according to at least one of a number of used pages, a position of the page, or a number of programmed memory cells.

Embodiments will now be described with reference to the drawings. In the respective drawings, like members are labeled with like reference numerals. Semiconductor devices of the embodiments are semiconductor memory devices having memory cell array.

First Embodiment

Figure 2:
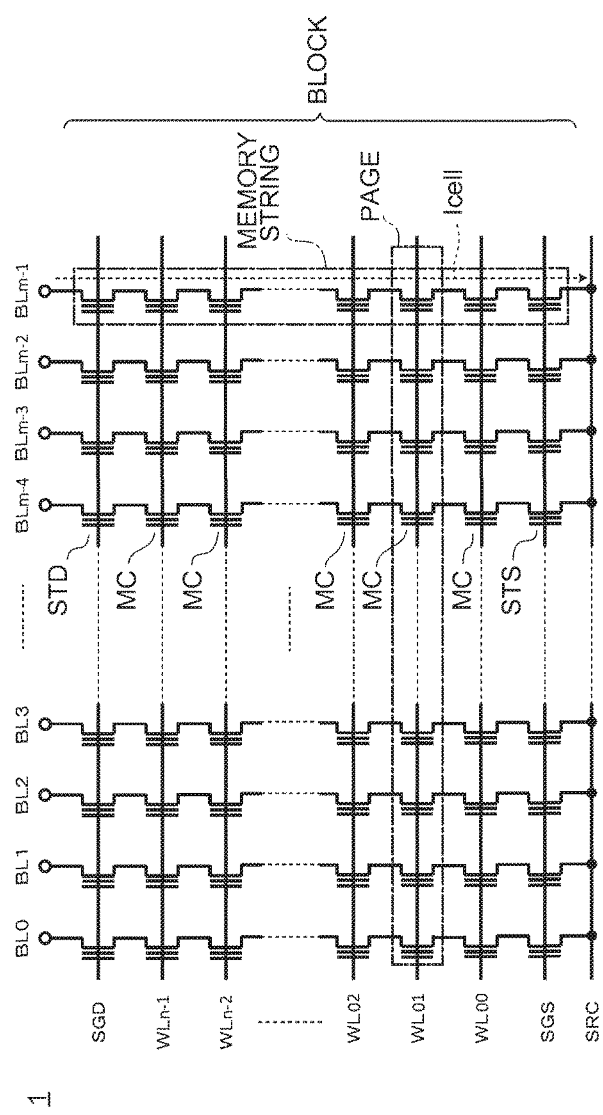
FIG. 2 is a schematic circuit diagram of a memory cell array.
Figure 3:
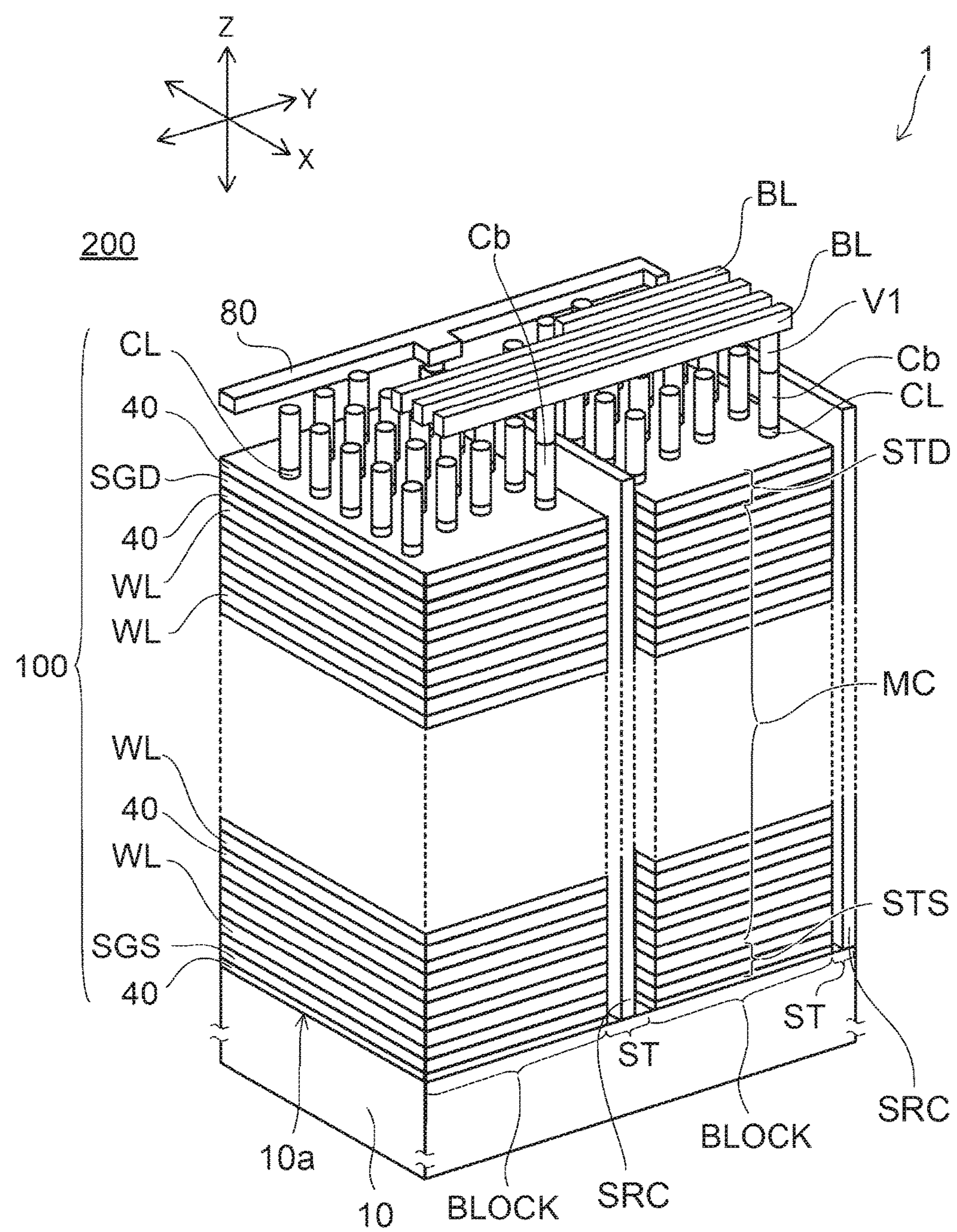
FIG. 3 is a schematic perspective view of the memory cell array.

FIG. 1 is a schematic block diagram of a semiconductor device 200 of a first embodiment. FIG. 2 is a schematic circuit diagram of a memory cell array 1. FIG. 3 is a schematic perspective view of the memory cell array 1. In FIG. 3, two mutually-orthogonal directions parallel to a major surface 10*a* of a substrate 10 are taken as an X-direction and a Y-direction. The XY plane is a plane parallel to the major surface 10*a*. A direction orthogonal to both the X-direction and the Y-direction is taken as a Z-direction (the stacking direction of a stacked body 100). In the specification, “down” refers to a direction toward the substrate 10; and “up” refers to a direction away from the substrate 10.

As shown in FIG. 1, the semiconductor device 200 includes a memory cell array 1.

As shown in FIG. 2, a drain-side selection transistor STD, memory cells MC, and a source-side selection transistor STS are provided in the memory cell array 1. The multiple memory cells MC are connected in series between the drain-side selection transistor STD and the source-side selection transistor STS. This is called a "memory string." In the example, one "memory string" includes n memory cells MC. One end of the current path for the multiple memory strings is electrically connected commonly to a source line SRC. Each of the other ends of the current path of multiple memory strings MS is electrically connected to a bit line BL (BL0 to BLm−1).

The gate electrode of the drain-side selection transistor STD is electrically connected to a drain-side selection gate line SGD. The gate electrodes of the memory cells MC are electrically connected to word lines WL (WL00 to WLn−1). The gate electrode of the source-side selection transistor STS is electrically connected to a source-side selection gate line SGS. The multiple memory cells MC that are connected to one of the word lines WL are included in a unit called a "page." The "page" is the smallest unit of the program and the read. In the example, one "page" includes m memory cells MC.

Multiple "pages" and multiple "memory strings (MS)" are included in a unit called a "block." The "block" is the smallest unit of the erase. In the example, n "pages" and m "memory strings (MS)" are included in one "block." In the example, one "block" includes n×m memory cells MC.

FIG. 3 is a schematic perspective view of the memory cell array 1.

As shown in FIG. 3, the semiconductor device 200 is a memory device having a three-dimensional structure. The stacked body 100 is provided on the major surface 10*a* of the substrate 10. Multiple columnar units CL and multiple slits ST are provided in the stacked body 100 of the memory cell array 1. The source-side selection gate line SGS is provided on the major surface 10*a* of the substrate 10. The substrate 10 is, for example, a semiconductor substrate. The semiconductor substrate includes, for example, monocrystalline silicon. The conductivity type of the substrate 10 is, for example, a P-type in the portion where the memory cell array 1 is provided. The multiple word lines WL are provided on the source-side selection gate line SGS. The drain-side selection gate line SGD is provided on the multiple word lines WL. The drain-side selection gate line SGD, the multiple word lines WL, and the source-side selection gate line SGS are electrode layers. The number of stacks of electrode layers is arbitrary.

The electrode layers (SGD, WL, and SGS) are stacked to be separated from each other. An insulator 40 is disposed in each region between the electrode layers (SGD, WL, and SGS). The insulator 40 may be an insulator such as a silicon oxide film, etc., or may be an air gap.

At least one selection gate line SGD is used as the gate electrode of the drain-side selection transistor STD. At least one selection gate line SGS is used as the gate electrode of the source-side selection transistor STS. One of the word lines WL is used as the gate electrode of the memory cell MC. The memory cell MC includes a charge storage portion between the word line WL and the channel. The memory cell MC stores information according to the amount of the charge or the existence/absence of the charge stored in the charge storage portion.

The slits ST extend along the Z-direction and the X-direction orthogonal to the Z-direction in the interior of the stacked body 100. The Z-direction is the stacking direction of the stacked body 100. For example, not-shown insulators are provided inside the slits ST. Thereby, the stacked body 100 is electrically divided along the X-direction. The regions that are divided by the slits ST are the "blocks." For example, the source lines SRC are provided inside the slits ST. The multiple source lines SRC have a shunt connection by an interconnect 80 extending in the Y-direction. For example, the source lines SRC may be provided between the substrate 10 and the stacked body 100.

The columnar units CL extend along the Z-direction in the interior of the stacked body 100. The configurations of the columnar units CL are, for example, circular columnar or elliptical columnar configurations. For example, the columnar units CL are arranged in a staggered lattice configuration or a square lattice configuration inside the memory cell array 1. The drain-side selection transistor STD, the multiple memory cells MC, and the source-side selection transistor STS are provided for the columnar unit CL.

The multiple bit lines BL are disposed above the upper end portions of the columnar units CL. The multiple bit lines BL extend in the Y-direction. The Y-direction is orthogonal to the X-direction along the major surface 10*a* of the substrate 10. The upper end portion of the columnar unit CL is electrically connected to one of the bit lines BL via a contact portion Cb and a via V1. One bit line is electrically connected to one columnar unit CL selected from each "block."

As shown in FIG. 1, a column control circuit 201 and a row control circuit 202 are provided outside the memory cell array 1.

The column control circuit 201 controls the voltages of the bit lines BL and the voltages of the source lines SRC in the read operation of the information from the memory cells MC, in the program operation of the information to the memory cells MC, and in the erase operation of the information from the memory cells MC.

The row control circuit 202 controls the voltages of the drain-side selection gate line SGD, the word lines WL, and the source-side selection gate line SGS in the read operation, the program operation, and the erase operation.

A data input/output (I/O) buffer 203 performs the input of the information to the semiconductor device 200 and the output of the information from the semiconductor device 200. For example, the input information (the external input) that is transmitted by a host 204 is input to the data I/O buffer 203. Also, the data I/O buffer 203 transmits the output information (the external output) to the host 204.

The external input includes, for example, command data, address data, and program data. The command data is output from the data I/O buffer 203 to a command interface 205. The address data is output from the data I/O buffer 203 to an address register 206. The program data is output from the data I/O buffer 203 to the column control circuit 201. The external output includes, for example, the read data.

For example, the external control signals that are transmitted by the host 204 are input to the command interface 205. Based on the external control signals, the command interface 205 judges whether the external input that is input to the data I/O buffer 203 is, for example, command data, address data, or program data. If the signals are command data, the command interface 205 transmits the command data to a state machine 207.

The state machine 207 controls the operations of the entire semiconductor device 200. The state machine 207 generates the internal control signals based on the command data. For example, the internal control signals are used to control the read operation, the program operation, and the erase operation. For example, the internal control signals are output to the column control circuit 201, the row control circuit 202, and a voltage generation circuit 208. Also, the state machine 207 controls the information (the status information) indicating the operating state of the semiconductor device 200. For example, the status information also can be output to the host in accordance with a request.

Based on the internal control signals, the voltage generation circuit 208 generates the internal voltage necessary for the read operation, the program operation, and the erase operation. For example, the internal voltage that is generated is supplied to the column control circuit 201 and the row control circuit 202.

<Read Operation: Read Operation in Accordance with Read Command>

Figure 4:
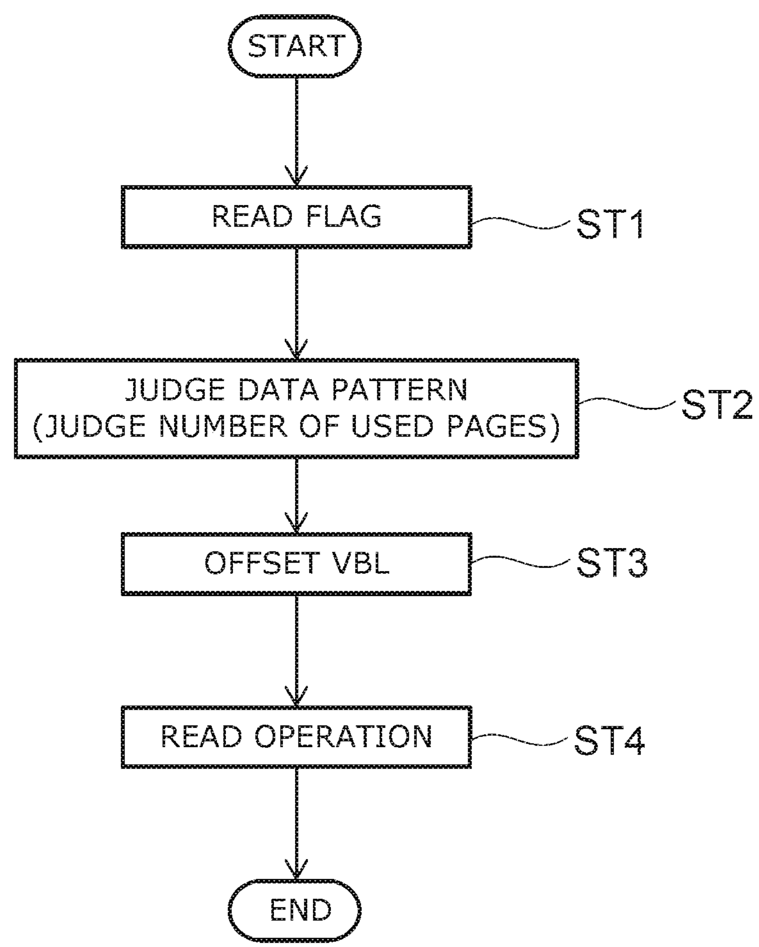
FIG. 4 is a flowchart showing an example of a read operation of the first embodiment.

FIG. 4 is a flowchart showing an example of the read operation of the first embodiment. The read operation shown in FIG. 4 is, for example, the read operation in accordance with the read command.

For example, the semiconductor device 200 starts the read operation when the semiconductor device 200 receives the read command transmitted by the host 204.

When the read operation is started, a flag is read as shown in step ST1 in FIG. 4. For example, the flag is recorded in the page among the n pages from which the read operation is to be performed initially. For example, the read operation is performed in order from the pages proximal to the source line SRC toward the bit line BL. As shown in FIG. 2, in the semiconductor device 200, the page that includes the word line WL00 is most proximal to the source line SRC. For example, the flag is recorded in the page including the word line WL00.

Figure 5:
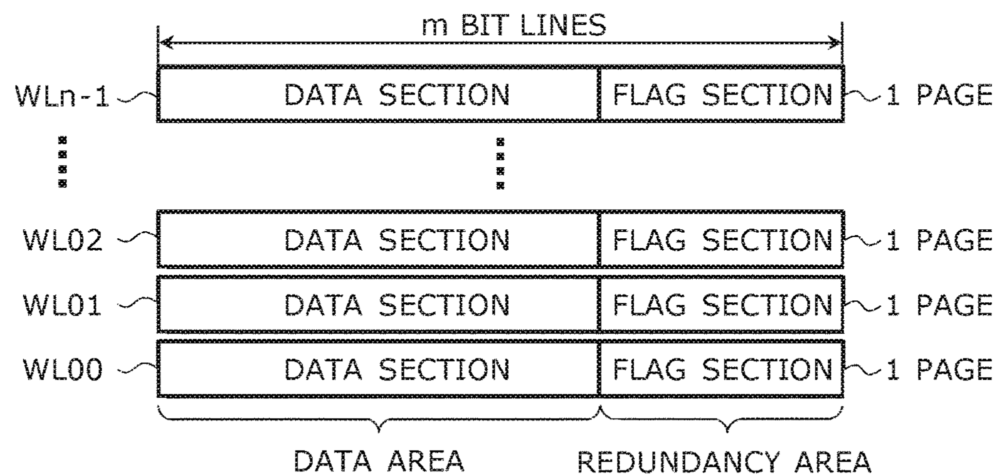
FIG. 5 is a schematic view showing a configuration of the pages.

FIG. 5 is a schematic view showing the configuration of the pages.

As shown in FIG. 5, the page includes a data area and a redundancy area. The data area is an area to which the information is programmable, readable, and erasable arbitrarily by the user. The redundancy area is, for example, the area inside the page where the control information of the data or the like is recorded. One page is set every word line. In the case where there are n word lines WL inside one memory string, the number of pages is "n." One page includes a data section corresponding to the data area and a section corresponding to the redundancy area. In FIG. 5, a flag section that records the flag is shown as the section corresponding to the redundancy area. For example, in the first embodiment, information relating to the data pattern of the block to which the page belongs is included in the information recorded in the flag section. For example, the information that relates to the data pattern includes information indicating the number of pages being used among the n pages (the number of used pages). The information that relates to the data pattern is recorded in the flag section of the word line WL00.

Then, as shown in step ST2 in FIG. 4, the data pattern, e.g., how many pages among the n pages are being used (the number of used pages), is judged from the flag that was read.

One block includes n pages. Normally, information is recorded in all of the n pages of substantially all of the blocks. However, rarely, there is a block in which information is not recorded in all of the n pages. In the specification hereinbelow, such a block is called a partially-programmed block.

Figure 6:
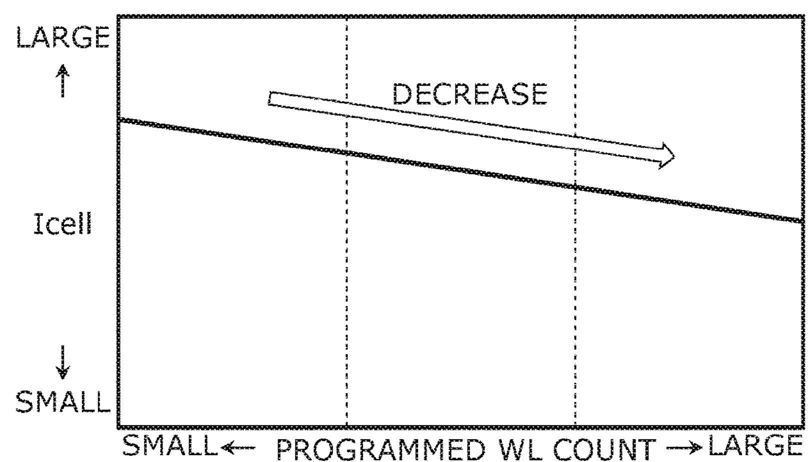
FIG. 6 is a schematic view showing the relationship between a cell current and a programmed word line count.

FIG. 6 is a schematic view showing the relationship between a cell current Icell and the programmed word line WL count. The programmed word line WL count is the number of used pages.

As shown in FIG. 6, the cell current Icell has a tendency to decrease as the programmed word line WL count (the number of used pages) increases.

For example, it is assumed that the memory cell MC stores the information of 2 bit/1 cell. In the page being used, a threshold voltage Vth of the memory cell MC has one of an "E-level (erase state)," an "A-level," a "B-level," or a "C-level."

Figure 7:
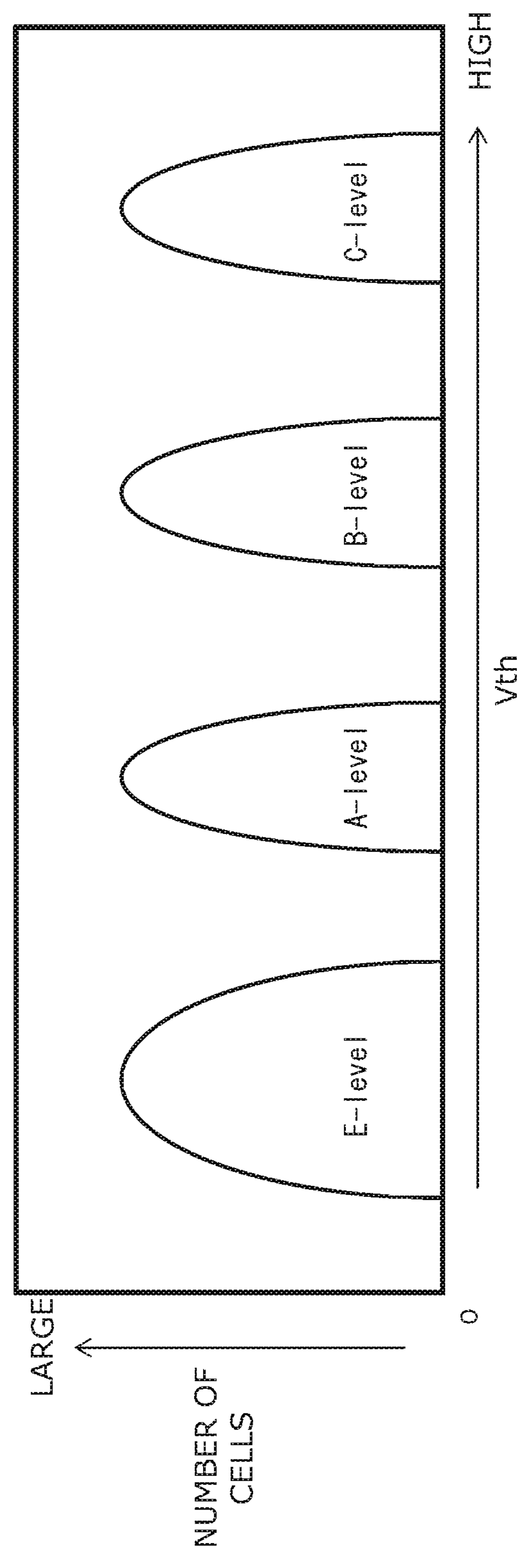
FIG. 7 is a figure showing distributions of a threshold voltage.

FIG. 7 is a figure showing distributions of the threshold voltage Vth.

For example, the threshold voltage Vth increases in the order of the "E-level," the "A-level," the "B-level," and the "C-level."

Figure 8:
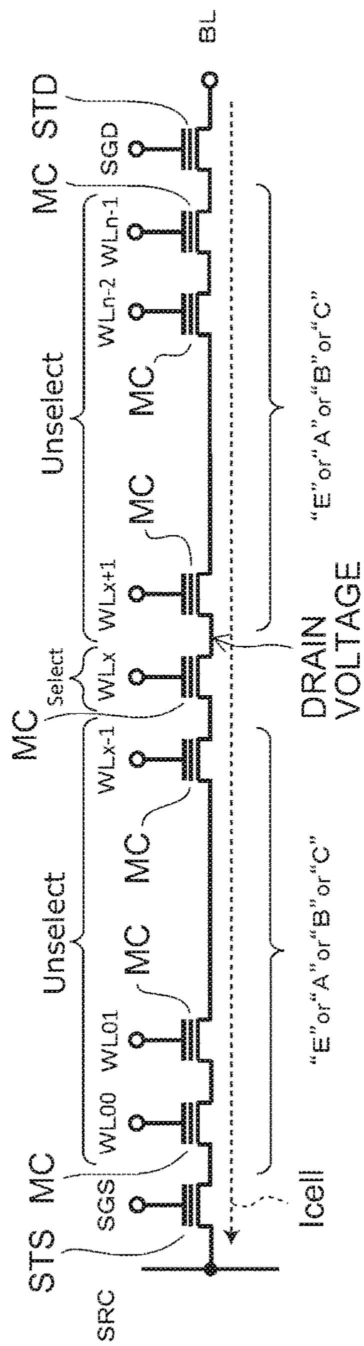
FIG. 8 is a figure showing a memory string.
Figure 9:
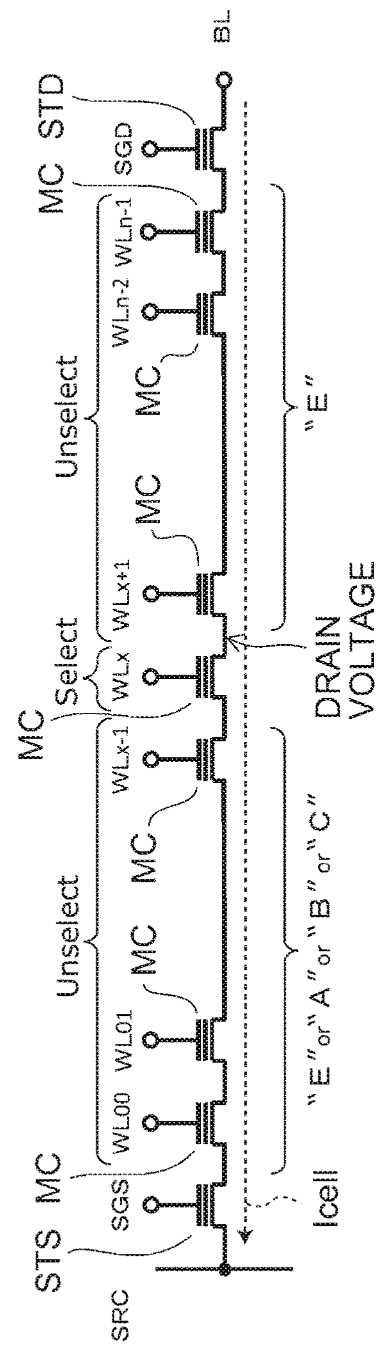
FIG. 9 is a figure showing a memory string.

FIG. 8 and FIG. 9 are figures showing memory strings.

For example, in the case where all of the n pages are being used as shown in FIG. 8, for example, the threshold voltages Vth of the E- to C-levels coexist in the n memory cells MC inside one memory string. In the read operation, the drain voltage of the selected memory cell MC is affected by the threshold voltages Vth of the memory cells MC connected from the selected memory cell MC to the bit line BL. For example, the drain voltage of the selected memory cell MC drops more easily as the memory cells MC having high threshold voltages Vth increase between the selected memory cell MC and the bit line BL. As a result, the cell current Icell that flows through the memory string flows less easily as the number of used pages increases.

Conversely, as shown in FIG. 9, in the pages not being used, the threshold voltage Vth of the memory cell MC is the "E-level." Therefore, in the partially-programmed block, the drain voltage of the selected memory cell MC is not easily affected by the threshold voltages Vth of the memory cells MC connected from the selected memory cell MC to the bit line BL. Accordingly, in the read operation, the cell current Icell flows easily compared to a memory string that includes many memory cells MC having high threshold voltages Vth.

Thus, in the partially-programmed block, compared to a block in which all of the n pages are programmed, a large cell current Icell flows easily in the read operation. Therefore, it is undesirably judged that the threshold voltage Vth of the selected memory cell MC is shifted to the "negative side" (the threshold voltage Vth has decreased). Accordingly, in the partially-programmed block, the optimal range of the threshold voltage Vth corresponding to the information to be stored is undesirably shifted from a block in which all of the n pages are programmed.

Figure 10:
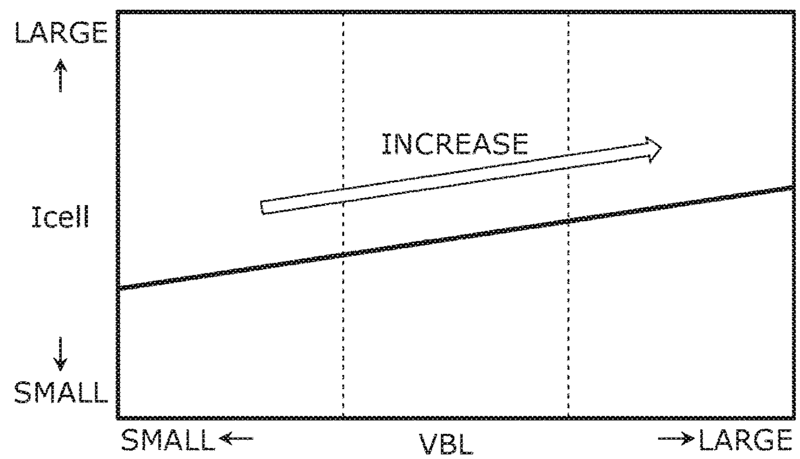
FIG. 10 is a schematic view showing the relationship between the cell current and a pre-charge voltage of the bit line.

FIG. 10 is a schematic view showing the relationship between the cell current Icell and a pre-charge voltage VBL of the bit line.

As shown in FIG. 10, the cell current Icell has a tendency to increase as the value of the pre-charge voltage VBL increases.

In the first embodiment, focusing on the relationship between the pre-charge voltage VBL and the cell current Icell shown in FIG. 10, the value of the pre-charge voltage VBL is changed according to the number of used pages as shown in step ST3 in FIG. 4 (OFFSET VBL). For example, in the case where many pages are being used, the value of the pre-charge voltage VBL is set to a first value. In the case where few pages are being used, the value of the pre-charge voltage VBL is set to a second value that is lower than the first value. For example, the column control circuit 201 shown in FIG. 1 performs the modification of the value of the pre-charge voltage VBL.

Figure 11:
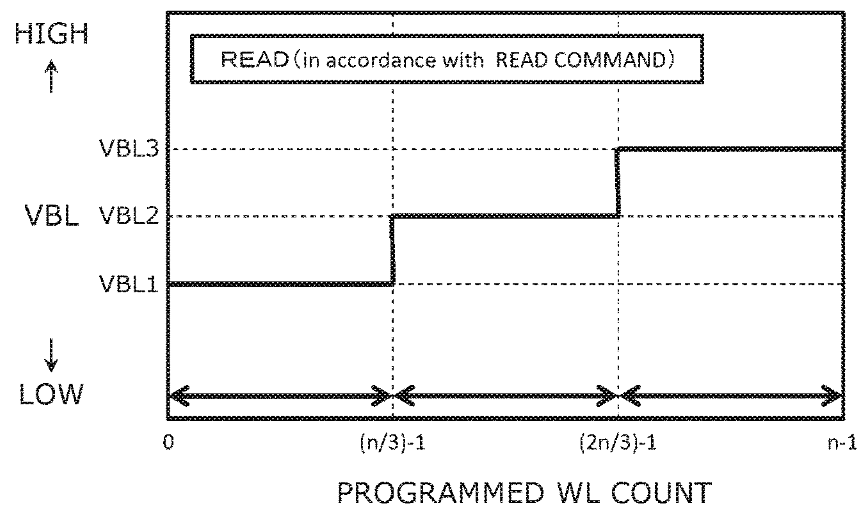
FIG. 11 is a schematic view showing the relationship between the pre-charge voltage and the programmed word line count.

FIG. 11 is a schematic view showing the relationship between the pre-charge voltage VBL and the programmed word line count.

As shown in FIG. 11, for example, the programmed word line WL count (the number of used pages) is judged by being divided into multiple groups. In the first embodiment, for example, the number of pages being used is judged by being divided into three groups.

<<0 to ⅓ of the Pages Used>>

If the programmed word line WL count is not more than "(n/3)−1," the pre-charge voltage VBL is set to "VBL1."

<<⅓ to ⅔ of the Pages Used>>

If the programmed word line WL count exceeds "(n/3)−1" and is not more than "(2n/3)−1," the pre-charge voltage VBL is set to "VBL2." The relationship between the voltage VBL1 and the voltage VBL2 is "VBL2>VBL1."

<<⅔ to all of the Pages Used>>

If the programmed word line WL count exceeds "(2n/3)−1" and is not more than "n−1," the pre-charge voltage VBL is set to "VBL3." The relationship between the voltage VBL2 and the voltage VBL3 is "VBL3>VBL2."

Figure 12:
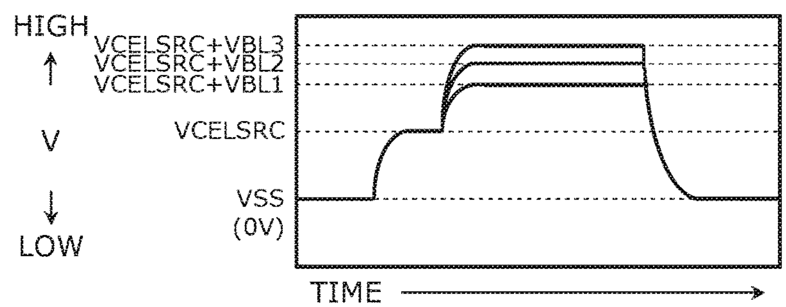
FIG. 12 is a schematic view showing the voltage waveform image of the bit line.

FIG. 12 is a schematic view showing the voltage waveform image of the bit line BL.

A voltage VSS shown in FIG. 12 is the circuit internal ground potential. The voltage VSS is, for example, 0 V. A voltage VCELSRC is the voltage of the source line SRC. In step ST3, the pre-charge voltage VBL that is applied to the bit line BL is changed to one of VBL1, VBL2, or VBL3 according to the number of used pages. As a result, for example, the voltage of the bit line BL is changed to the voltage VCELSRC+VBL1, the voltage VCELSRC+VBL2, and the voltage VCELSRC+VBL3.

Then, the read operation is performed as shown in step ST4 in FIG. 4. In the read operation, the pre-charge voltage VBL is applied to the m bit lines BL0 to BLm−1. In this state, a read voltage Va is applied to the selected one of the word lines WL; and a pass voltage Vpass is applied to the remaining word lines WL. The pass voltage Vpass is a voltage that switches the memory cell MC "ON" regardless of the threshold voltage. Further, a voltage that switches the drain-side selection transistor STD and the source-side selection transistor STS "ON," e.g., a voltage Vdd, is applied to the drain-side selection gate line SGD and the source-side selection gate line SGS. The information that is stored by the memory cell MC is judged by whether or not, for example, the voltages of the bit lines BL0 to BLm−1 are maintained at the pre-charge voltage VBL or are decreasing.

In the read operation in the first embodiment, the pre-charge voltage VBL that is applied to the bit line BL is changed according to the data pattern of the block where the read operation is to be performed. In the first embodiment, for example, the pre-charge voltage VBL is set to be low in the case where the number of used pages of the block is small, and is set to be high in the case where the number of used pages of the block is large. Thereby, in the read operation, the fluctuation of the cell current Icell occurring according to whether the number of used pages is large or small can be suppressed to be small.

Thus, according to the first embodiment, the fluctuation of the cell current Icell corresponding to the data pattern programmed to the memory cells MC can be suppressed. Accordingly, for example, the circumstances in which the optimal range of the threshold voltage Vth in the partially-programmed block is shifted from that of a block in which all of the n pages are programmed can be suppressed.

In such a semiconductor device 200 of the first embodiment, the information can be read from the memory cell MC with high reliability even in the case where, for example, there is a partially-programmed block when using. Accordingly, according to the first embodiment, the likelihood of a misread is low; and the semiconductor device 200 having high reliability can be obtained.

Also, according to the first embodiment, the pre-charge voltage VBL is suppressed to be low in the state in which the number of used pages is small and a large cell current Icell flows. Therefore, the increase of the power consumption of the semiconductor device 200 also can be suppressed.

In the first embodiment recited above, for example, the information that indicates the number of used pages is recorded in the flag area of the page including the word line WL00. However, for example, in the case where the semiconductor device 200 includes a dummy word line between the word line WL00 and the source-side selection gate line SGS, it is also possible to record the information that indicates the number of used pages in, for example, the data area of the page including the dummy word line. While the word lines WL are pages usable by the user, the dummy word line is a page unusable by the user.

Also, in the first embodiment recited above, the value of the pre-charge voltage VBL is changed based on the data pattern, e.g., the information indicating the number of used pages. However, it is also possible to change the value of the pre-charge voltage VBL by judging whether or not the block is, for example, a partially-programmed block.

Further, it is also possible to set the value of the pre-charge voltage VBL to be lower as the number of used pages decreases.

These modifications are applicable also to the embodiments described below.

Second Embodiment

The second embodiment is an embodiment adaptable to a program verify read operation.

In the read operation in accordance with the read command, the fluctuation of the cell current Icell mainly is dependent on the threshold voltages Vth of the memory cells MC connected between the selected memory cell MC and the bit line BL.

Conversely, in the program verify read operation, the fluctuation of the cell current Icell is strongly dependent on the threshold voltages Vth of the memory cells MC connected between the selected memory cell MC and the source line SRC. This is so-called "back pattern dependency (BPD)."

For example, the program verify read operation is performed in a state similar to the state shown in FIG. 9. This is because there are cases in the program verify read operation where all of the threshold voltages Vth of the memory cells MC connected between the selected memory cell MC and the bit line BL are set to the "E-level (the erase state)."

Figure 13:
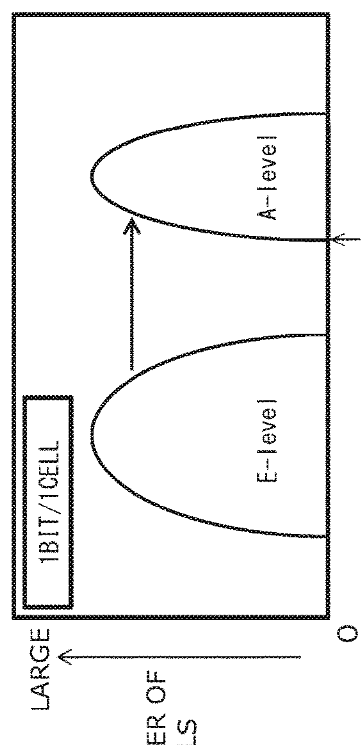
FIG. 13 is a figure showing the distribution of the threshold voltage.
Figure 14:
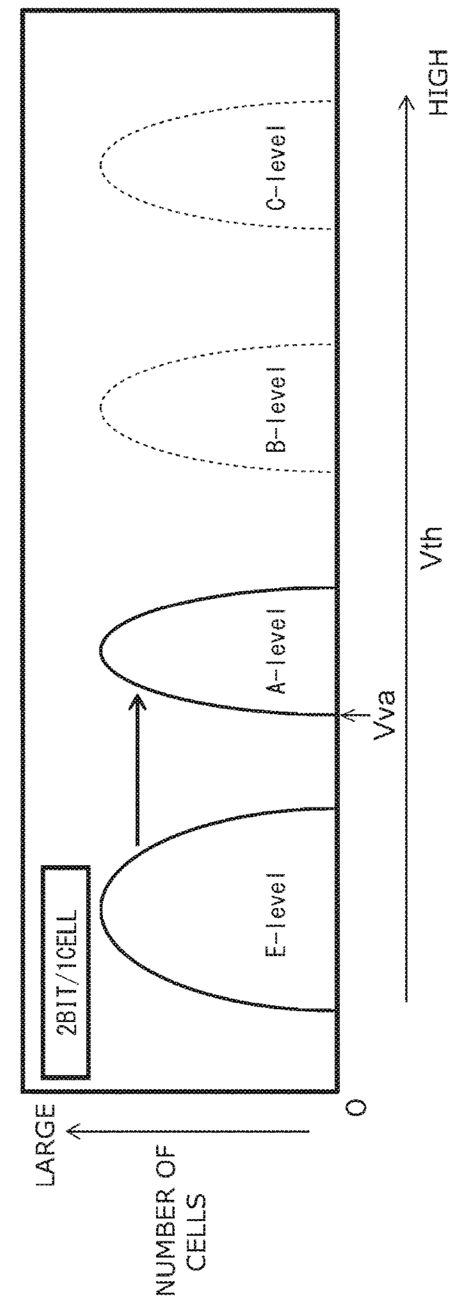
FIG. 14 is a figure showing the distribution of the threshold voltage.
Figure 15:
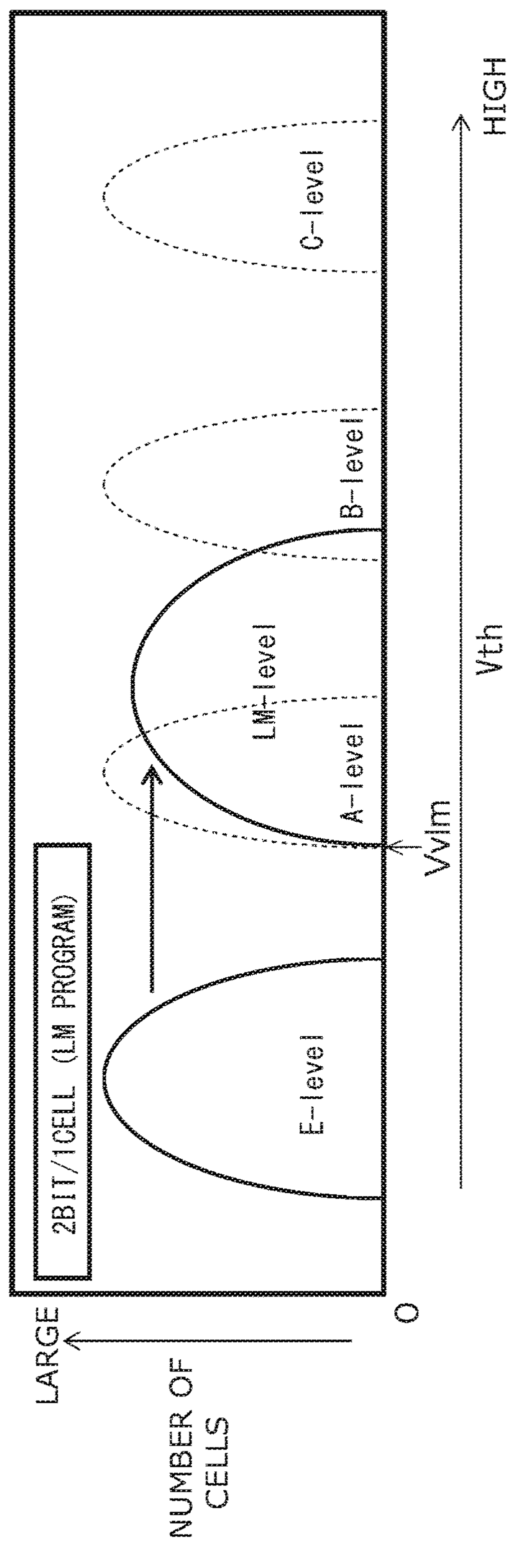
FIG. 15 is a figure showing the distribution of the threshold voltage.

FIG. 13 to FIG. 15 are figures showing distributions of the threshold voltage Vth.

For example, in the case of the 1 bit/1 cell method as shown in FIG. 13, the program verify read operation sets the voltage of the selected word line WL to a verify read voltage Vv. In the program verify read operation, all of the threshold voltages Vth of the memory cells MC connected between the selected memory cell MC and the bit line BL are set to the "E-level."

Also, for example, in the 2 bit/1 cell method, programming may be performed in the order of the "A-level," the "B-level," and the "C-level" in increasing order from the threshold voltage. In such a case, as shown in FIG. 14, the program verify read operation of the "A-level" sets the voltage of the selected word line WL to a verify read voltage Vva. In the program verify read operation of the "A-level," all of the threshold voltages Vth of the memory cells MC connected between the selected memory cell MC and the bit line BL are set to the "E-level."

Also, for example, in the 2 bit/1 cell method, a so-called "LM program" may be performed. In such a case, as shown in FIG. 15, the program verify read operation of an "LM-level (an intermediate level between the A-level and the B-level)" sets the voltage of the selected word line WL to a verify read voltage Vvlm. In the program verify read operation of the "LM-level," all of the threshold voltages Vth of the memory cells MC connected between the selected memory cell MC and the bit line BL are set to the "E-level."

Figure 16:
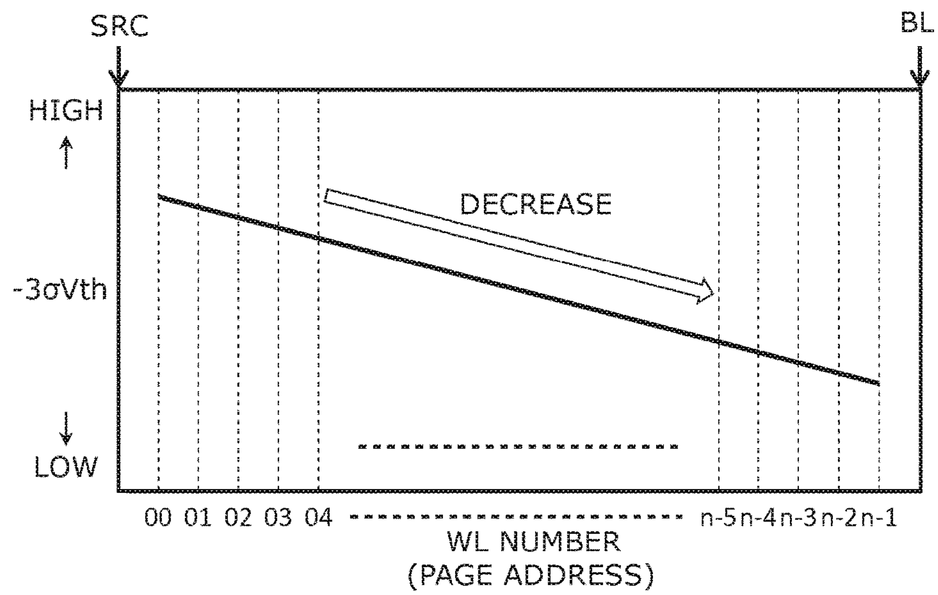
FIG. 16 is a schematic view showing the relationship between the word line number and the threshold voltage.

FIG. 16 is a schematic view showing the relationship between the word line number and the threshold voltage (−3σVth). The average value of the low portion (−3σ) of the distribution of the threshold voltages Vth that the memory cells MC may have after the program is shown in FIG. 16. The level of the threshold voltage Vth is, for example, the "C-level." The word line number corresponds to the page address.

As shown in FIG. 16, the threshold voltage Vth of the memory cell MC after the program verify read operation for the word lines WL decreases from the source line SRC toward the bit line BL. This trend suggests that BPD occurs and the cell current Icell flows less easily as the selected memory cell MC approaches the bit line BL.

Figure 17:
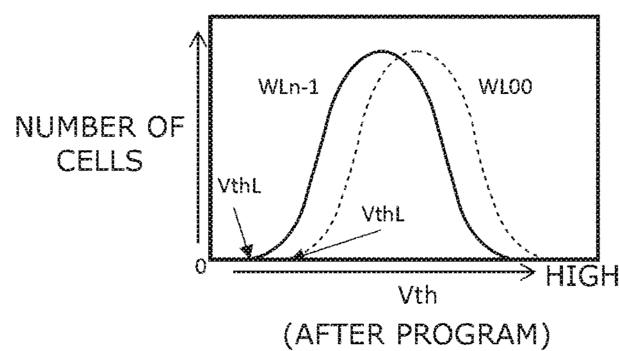
FIG. 17 is a schematic view showing the relationship between the threshold voltage after the program and the number of memory cells.

FIG. 17 is a schematic view showing the relationship between the threshold voltage Vth after the program and the number of memory cells.

From the trend shown in FIG. 16, for example, the distribution of the threshold voltage Vth after the program shifts to the positive side for the memory cell MC connected to the word line WL00 and shifts to the negative side for the memory cell MC connected to the word line WLn−1 as shown in FIG. 17. Therefore, the lowest threshold voltage VthL of the memory cell MC connected to the word line WLn−1 is lower than the lowest threshold voltage VthL of the memory cell MC connected to the word line WL00. The word line WL00 is the word line WL most proximal to the source line SRC; and the word line WLn−1 is the word line WL most proximal to the bit line BL.

As a countermeasure for such a "distribution shift" of the threshold voltage Vth, for example, it may be considered to set the verify read voltage and/or the read voltage applied to the word line WL to be low for the memory cells MC proximal to the source line SRC and high for the memory cells MC proximal to the bit line BL.

However, in the memory device having the three-dimensional structure shown in FIG. 3, the memory cells MC are stacked in the height direction (the Z-direction). Therefore, the difference between the heat applied to the memory cells MC that are proximal to the substrate 10 and the heat applied to the memory cells MC distal to the substrate 10 is large inside the substrate 10 compared to a memory device in which all of the memory cells are provided in a two-dimensional structure. Therefore, the temperature characteristics of the memory device having the three-dimensional structure are delicate compared to the temperature characteristics of the memory device having the two-dimensional structure. The read voltage and the verify read voltage are applied directly to the gate electrode of the memory cell MC. Therefore, the temperature characteristics of the memory cell MC are affected easily. Accordingly, it is difficult to change the read voltage and the verify read voltage according to the position of the memory cell MC in the memory device having the three-dimensional structure.

Therefore, in the second embodiment, the value of the pre-charge voltage VBL is changed in the program verify read operation according to the position of the selected word line WL, in other words, the position of the page.

<Read Operation: Read Operation in Accordance with Program Verify Operation>

Figure 18:
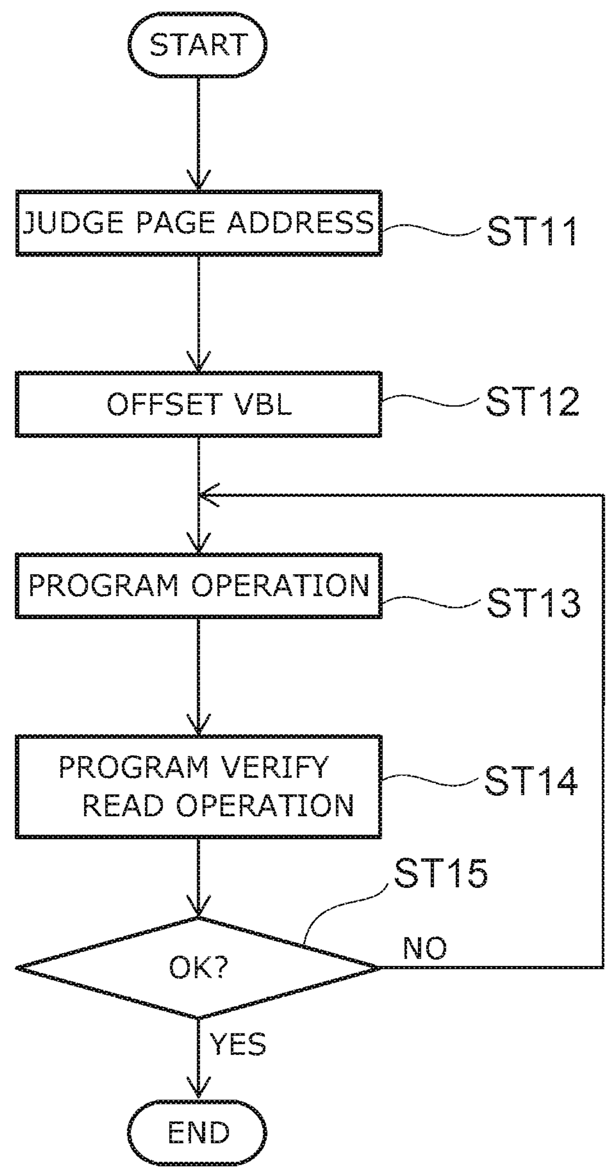
FIG. 18 is a flowchart showing an example of the read operation of the second embodiment.

FIG. 18 is a flowchart showing an example of the read operation of the second embodiment. The read operation shown in FIG. 18 is the program verify read operation.

For example, the semiconductor device 200 starts the program operation when the semiconductor device 200 receives the program command transmitted by the host 204.

When the program operation is started, the page address is judged as shown in step ST11 in FIG. 18. The page address indicates the position of the word line WL.

Then, as shown in step ST12 in FIG. 18, the value of the pre-charge voltage VBL to be used in the program verify read operation is changed based on the page address (OFFSET VBL). For example, in the case where the position of the page is proximal to the source line SRC, the value of the pre-charge voltage VBL is set to a third value; and in the case where the position of the page is distal to the source line SRC, the value of the pre-charge voltage VBL is set to a fourth value that is higher than the third value.

Then, as shown in step ST13 in FIG. 18, the program operation is performed. In the program operation, one voltage of the program inhibit voltage (e.g., Vdd) or the program select voltage (e.g., Vss) is applied to the bit lines BL0 to BLm−1 according to the information to be programmed. Subsequently, for example, the voltage of the source-side selection gate line SGS is set to the voltage Vss; and, for example, the voltage of the drain-side selection gate line SG© is set to the voltage Vdd. Regardless of the state of the threshold voltage of the memory cell MC, the voltages of the word lines WL00 to WLn−1 are set to the pass voltage Vpass that switches the memory cells MC to "ON." Further, the selected one of the word lines WL is set to a program voltage Vpgm that is higher than the pass voltage Vpass. Thereby, the information corresponding to one voltage of the program inhibit voltage or the program select voltage is programmed to the m memory cells MC of one page connected to the selected word line WL. For example, the column control circuit 201 performs the control of the voltages of the bit lines BL0 to BLm−1. For example, the row control circuit 202 performs the control of the voltage of the source-side selection gate line SGS, the voltage of the drain-side selection gate line SGD, and the voltages of the word lines WL00 to WLn−1.

Then, as shown in step ST14 in FIG. 18, the program verify read operation is performed. In the program verify read operation, the pre-charge voltage VBL is applied to the bit lines BL0 to BLm−1. Here, the pre-charge voltage VBL that is applied is selected from one of the pre-charge voltage VBL1, VBL2, or VBL3 changed in step ST12.

Figure 19:
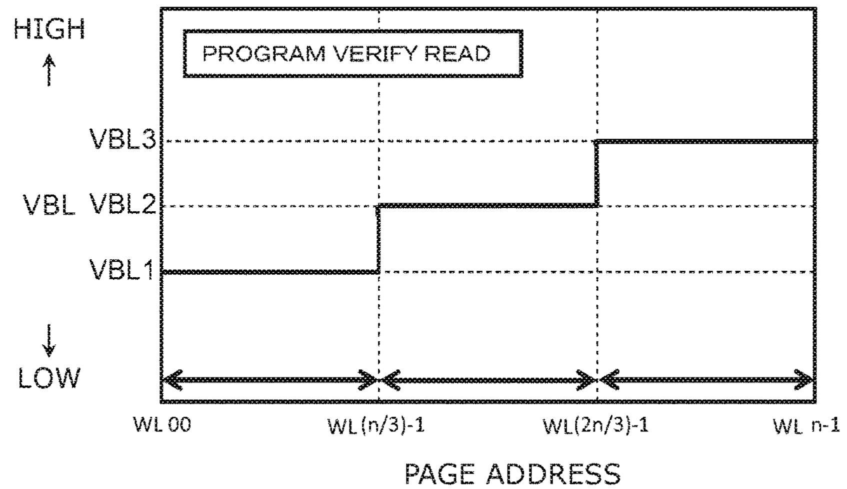
FIG. 19 is a schematic view showing the relationship between the page address and the pre-charge voltage.

FIG. 19 is a schematic view showing the relationship between the page address and the pre-charge voltage VBL.

In the second embodiment as shown in FIG. 19, for example, the pre-charge voltage VBL is changed as follows.

<<WL00 to WL(n/3)−1 or Lower Designated>>

In the case where the page address designates from the word line WL00 to the word line WL(n/3)−1 or lower, the pre-charge voltage VBL is set to "VBL1."

<<Higher than WL(n/3)−1 to WL(2n/3)−1 or Lower Designated>>

In the case where the page address designates higher than the word line WL(n/3)−1 to the word line WL(2n/3)−1 or lower, the pre-charge voltage VBL is set to "VBL2." Similarly to the first embodiment, the relationship between the voltage VBL1 and the voltage VBL2 is "VBL2>VBL1."

<<Higher than WL(2n/3)−1 to WLn−1 or Lower Designated>>

In the case where the page address designates higher than the word line WL(2n/3)−1 to the word line WLn−1 or lower, the pre-charge voltage VBL is set to "VBL3." Similarly to the first embodiment, the relationship between the voltage VBL2 and the voltage VBL3 is "VBL3>VBL2."

Thus, by changing the pre-charge voltage VBL according to the page address, for example, circumstances such as that shown in FIG. 17 in which the distribution of the threshold voltage Vth after the program shifts between the memory cells MC connected to the word lines WL proximal to the source line SRC and the memory cells MC connected to the word lines WL proximal to the bit line BL can be suppressed. For example, the column control circuit 201 performs the control of the pre-charge voltage VBL according to the page address.

Then, as shown in step ST15 in FIG. 18, it is judged whether or not the threshold voltage Vth of the memory cell MC has reached the threshold voltage corresponding to the information to be programmed. In the judgment, the program verify read voltage is applied to the selected word line in the state in which one of the pre-charge voltages VBL1 to VBL3 is applied to the bit lines BL0 to BLm−1. In the read operation, if the memory cell MC is "ON," it is judged that the threshold voltage Vth has not reached the threshold voltage corresponding to the information to be programmed in step ST15 (NO). In this case, step ST13 and step ST14 are repeated again.

If the memory cell MC is "OFF," it is judged that the threshold voltage Vth has reached the threshold voltage corresponding to the information to be programmed (YES). Then, for example, if all of the memory cells MC of one page have been passed, the program operation of one page in accordance with the program command ends.

According to the second embodiment, in the program verify read operation, the pre-charge voltage VBL is set to be low in the case where the position of the word line WL (the page) is proximal to the source line SRC. Also, the pre-charge voltage VBL is set to be high in the case where the position is distal to the source line SRC and proximal to the bit line BL. For example, the position of the word line WL (the page) is judged from the page address for which the program operation is to be performed. Thereby, the fluctuation of the cell current Icell occurring according to the position of the word line WL for which the verify read operation is to be performed in the program verify read operation can be suppressed to be small. Accordingly, the circumstances in which the distribution of the threshold voltage Vth after the program shifts between the memory cells MC proximal to the source line SRC and the memory cells MC proximal to the bit line BL can be suppressed.

It is also possible to increase the value of the pre-charge voltage as the page to be programmed approaches the bit line BL from the source line SRC.

Third Embodiment

The third embodiment is an embodiment that is adaptable to an erase verify read operation.

After the erase operation, all of the threshold voltages Vth of the memory cells MC inside the block are set to the "E-level." However, after the erase operation, there are circumstances in which it is undesirably judged that the distribution of the threshold voltage Vth has shifted due to the data pattern, e.g., whether the number of the programmed memory cells MC is large or small, for the block prior to the erase operation.

Figure 20:
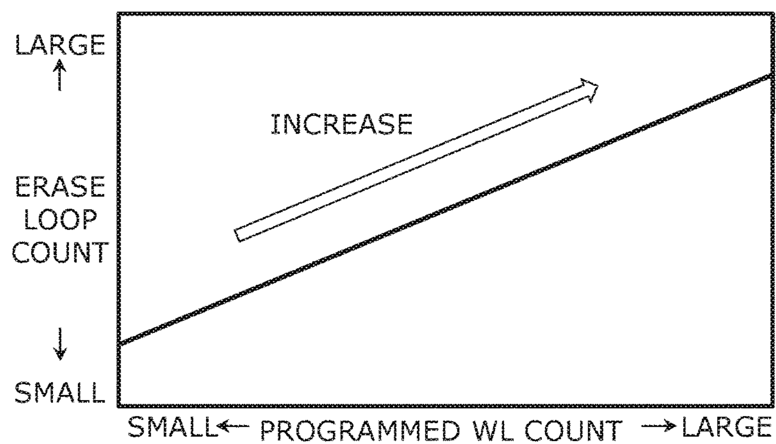
FIG. 20 is a schematic view showing the relationship between the erase loop count and the programmed word line count.

FIG. 20 is a schematic view showing the relationship between the erase loop count and the programmed word line count.

As shown in FIG. 20, the erase loop count increases as the programmed word line WL count (the number of used pages) increases. This phenomenon has become more pronounced in the memory device having the three-dimensional structure compared to the memory device having the two-dimensional structure.

The distribution of the threshold voltage Vth after the erase is shifted easily to the negative side when the erase loop count is large compared to when the erase loop count is small. Therefore, there are circumstances in which the likelihood of a memory cell MC having a "deep erase state" occurring increases. One cause is, for example, the erase operation being repeatedly performed. Each time the erase operation is repeated, the threshold voltage Vth of the memory cell MC shifts deeply to the negative side. When the memory cell MC undesirably has the "deep erase state," for example, the program operation is difficult.

Also, if the erase loop count is large, it can be said that there are many memory cells MC for which the threshold voltage Vth cannot be reduced sufficiently to the "E-level" by one erase operation. Therefore, in the erase verify read operation, a phenomenon similar to the phenomenon described in reference to FIG. 8 in the first embodiment may occur. In other words, in the erase verify read operation, for example, the drain voltage of the selected memory cell MC is undesirably affected by the threshold voltages Vth of the memory cells MC from the selected memory cell MC to the memory cell MC connected to the bit line BL.

Figure 21:
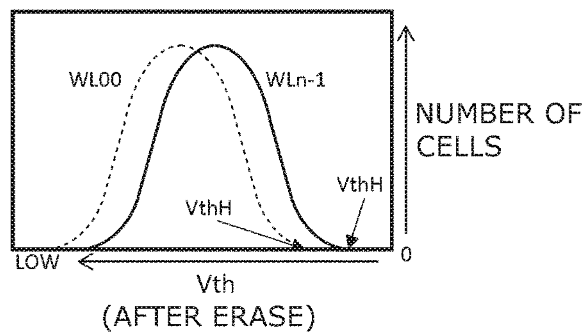
FIG. 21 is a schematic view showing the relationship between the threshold voltage after the erase and the number of memory cells.

FIG. 21 is a schematic view showing the relationship between the threshold voltage Vth after the erase and the number of memory cells.

As shown in FIG. 21, the cell current Icell flows easily when the number of used pages is small. Therefore, it is judged that the distribution of the threshold voltage Vth has shifted to the negative side.

However, the cell current Icell does not flow easily when the number of used pages is large. Therefore, it is judged that the threshold voltage Vth has shifted to the positive side compared when the number of used pages is small. The highest threshold voltage Vth inside the distribution of the threshold voltage Vth is a voltage VthH. For example, the erase loop is repeated until the voltage VthH falls below the erase verify read voltage applied to the gate electrode of the selected memory cell MC.

Thus, it is undesirably judged that the distribution of the threshold voltage Vth after the erase operation has shifted due to the data pattern inside the block for which the erase operation is to be performed.

For example, as a countermeasure for such a "distribution shift" of the threshold voltage Vth, it may be considered to program the same information to all of the memory cells MC inside the block for which the erase operation is to be performed. For example, the threshold voltages Vth of all of the memory cells MC inside the block for which the erase operation is to be performed are matched to be the "C-level." Subsequently, the erase operation is performed.

However, the reprogram count of the information increases because the program operation is performed every erase operation. Therefore, there is a risk that the "reprogram cycle life (the endurance)" of the semiconductor device 200 may be affected.

Therefore, in the third embodiment, in the erase verify read operation, the value of the pre-charge voltage VBL is changed according to the data pattern, e.g., the number of used pages.

<Read Operation: Read Operation in Accordance with Erase Verify Operation>

Figure 22:
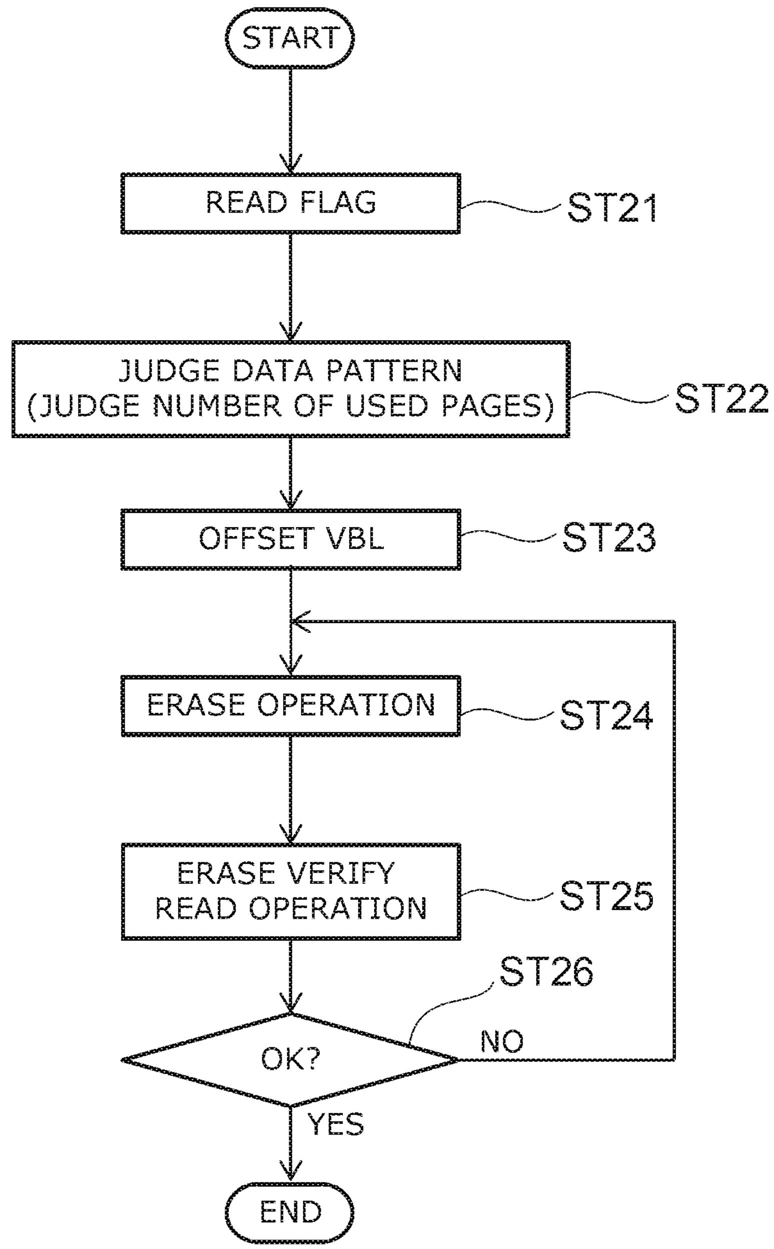
FIG. 22 is a flowchart showing an example of the read operation of the third embodiment.

FIG. 22 is a flowchart showing an example of the read operation of the third embodiment. The read operation shown in FIG. 22 is the erase verify read operation.

For example, the semiconductor device 200 starts the erase operation when the semiconductor device 200 receives the erase command transmitted by the host 204.

When the erase operation is started, the flag is read as shown in step ST21 in FIG. 22. Similarly to the first embodiment, the flag includes the data pattern, e.g., information indicating how many pages among the n pages are being used (the number of used pages), for the block to which the page belongs. Similarly to the first embodiment, for example, the flag is recorded in the flag area of the page including the word line WL00, or in the case where a dummy word line is included, in the data area of the page including the dummy word line.

Then, as shown in step ST22 in FIG. 22, the data pattern, e.g., how many pages among the n pages are being used (the number of used pages), is judged from the flag that was read.

Then, as shown in step ST23 in FIG. 22, the value of the pre-charge voltage VBL used in the erase verify read operation is changed according to the number of used pages (OFFSET VBL).

Figure 23:
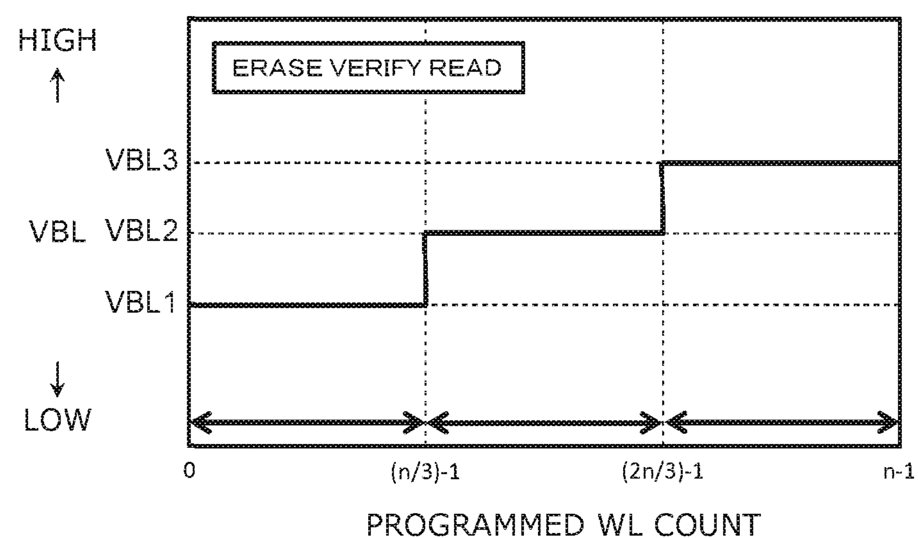
FIG. 23 is a schematic view showing the relationship between the pre-charge voltage and the programmed word line count.

FIG. 23 is a schematic view showing the relationship between the pre-charge voltage VBL and the programmed word line WL count.

As shown in FIG. 23, for example, the programmed word line WL count (the number of used pages) is judged by being divided into multiple groups. How the groups are divided and the value of the pre-charge voltage VBL is selected for each group are similar to those of the first embodiment. For example, if the programmed word line WL count is not more than "(n/3)−1," the pre-charge voltage VBL is set to "VBL1." Also, if the programmed word line WL count exceeds "(n/3)−1" and is not more than "(2n/3)−1," the pre-charge voltage VBL is set to "VBL2." If the programmed word line WL count exceeds "(2n/3)−1" and is not more than "n−1," the pre-charge voltage VBL is set to "VBL3." The relationship between the voltage VBL1, the voltage VBL2, and the voltage VBL3 is "VBL3>VBL2>VBL1."

Then, as shown in step ST24 in FIG. 22, the erase operation is performed. In the erase operation, for example, the bit lines BL0 to BLm−1, the source line SRC, the source-side selection gate line SGS, and the drain-side selection gate line SG© are set to be open. In this state, the voltages of the word lines WL00 to WLn−1 are set to the voltage Vss. Further, an erase voltage Vera (a positive high voltage) is applied to the channel. Thereby, the charge, e.g., the electrons, are discharged into the channel from the charge storage portions of the memory cells MC inside the block.

Then, as shown in step ST25 in FIG. 22, the erase verify read operation is performed. In the erase verify read operation, the pre-charge voltage VBL is applied to the bit lines BL0 to BLm−1. Here, the pre-charge voltage VBL that is applied is selected from one of the pre-charge voltage VBL1, VBL2, or VBL3 changed in step ST22.

Then, as shown in step ST25 in FIG. 22, it is judged whether or not the threshold voltage Vth of the memory cell MC has decreased to the threshold voltage corresponding to the "E-level." In the judgment, the erase verify read voltage is applied to the selected word line in the state in which one of the pre-charge voltages VBL1 to VBL3 is applied to the bit lines BL0 to BLm−1. If the memory cell MC is switched "OFF" in the read operation, it is judged in step ST25 that the threshold voltage Vth has not decreased to the threshold voltage corresponding to the "E-level" (NO). In this case, step ST24 and step ST25 are repeated again.

If the memory cell MC is switched "ON," it is judged that the threshold voltage Vth has decreased to the threshold voltage corresponding to the "E-level" (YES). Then, for example, if all of the memory cells MC inside the block have passed, the erase operation of one block in accordance with the program command ends.

According to the third embodiment, in the erase verify read operation, the pre-charge voltage VBL is changed according to the data pattern of the block for which the erase operation is to be performed. For example, in the third embodiment, the pre-charge voltage VBL is set to be low when, for example, the number of used pages of the block is small and high when the number of used pages of the block is large. Thereby, in the erase verify read operation, the fluctuation of the cell current Icell occurring according to whether the number of used pages is large or small can be suppressed to be small.

Accordingly, the circumstances in which it is judged that the distribution of the threshold voltage Vth after the erase operation has shifted due to the data pattern inside the block for which the erase operation is to be performed can be eliminated. As a result, according to the third embodiment, for example, the increase of the erase loop count can be suppressed; and the likelihood of a memory cell MC having a "deep erase state" occurring can be reduced.

Figure 24:
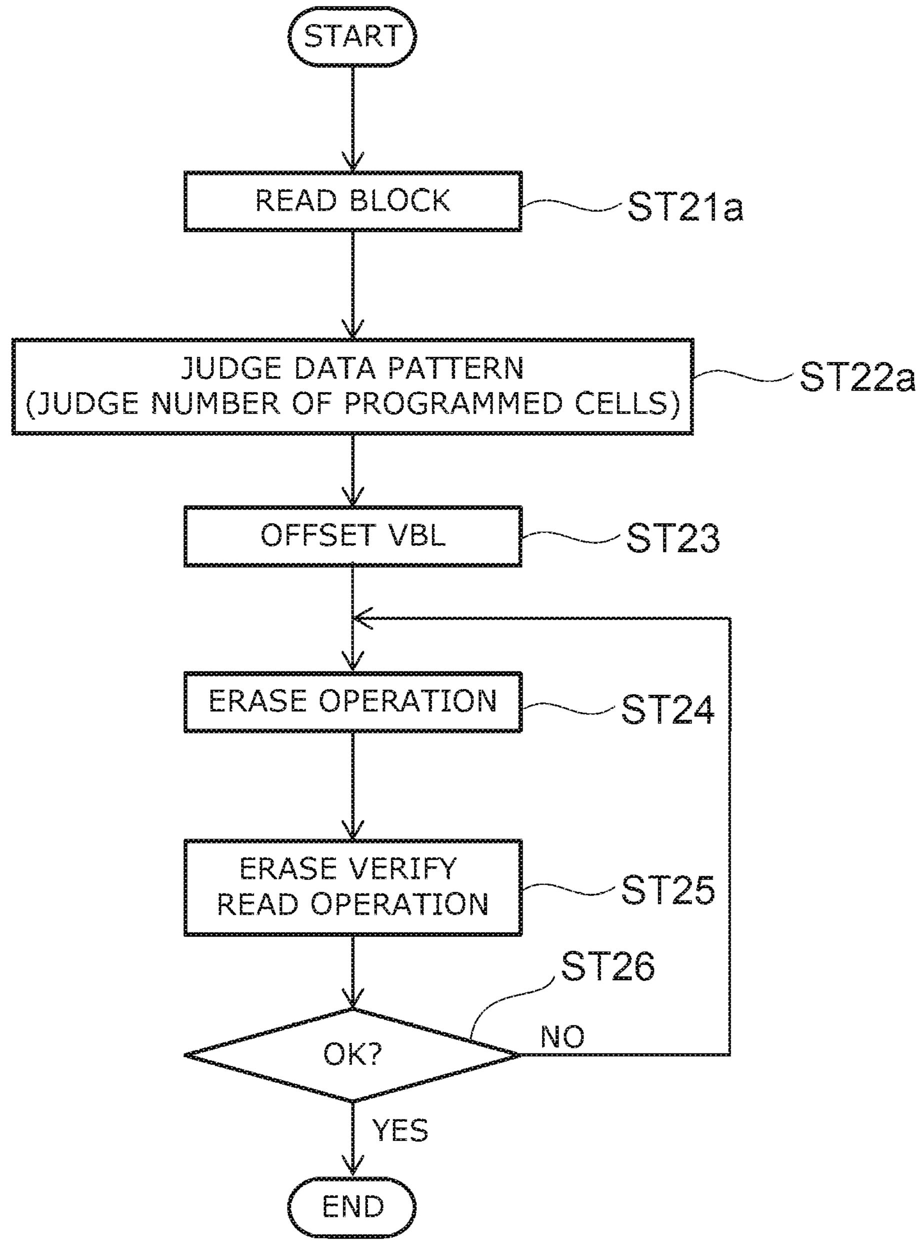
FIG. 24 is a flowchart showing another example of the read operation of the third embodiment.

FIG. 24 is a flowchart showing another example of the read operation of the third embodiment.

As shown in FIG. 24, the other example differs from the example described in reference to FIG. 22 in that in the erase verify read operation, the pre-charge voltage VBL that is applied to the bit line BL is changed not by judging the number of used pages per 1 block but by judging the number of programmed memory cells MC per 1 block.

For example, in the other example as shown in step ST21*a* in FIG. 24, the information is read from, for example, all of the memory cells MC inside one block (READ BLOCK).

Then, as shown in step ST22*a* in FIG. 24, the data pattern, e.g., the number of the programmed memory cells MC inside the one block, is judged from the information that is read.

The number of the programmed memory cells MC is, for example, the number of all of the memory cells MC other than the "E-level." For all of the memory cells MC other than the "E-level," the number of the "A-levels," the number of the "B-levels," and the number of the "C-levels" may be referenced further.

Then, as shown in step ST23 in FIG. 24, the value of the pre-charge voltage VBL to be used in the erase verify read operation is changed according to the number of the programmed memory cells MC (OFFSET VBL). For example, when the number of the programmed memory cells MC is large, the pre-charge voltage VBL is set to be high; and when the number of the programmed memory cells MC is conversely small, the pre-charge voltage VBL is set to be low.

Then, as shown in step ST24 in FIG. 24, the information is erased from all of the memory cells MC inside the one block. Subsequently, as shown in steps ST25 and 26, for example, an operation similar to the operation described in reference to FIG. 22 is performed.

Thus, in the erase verify read operation, it is also possible to change the pre-charge voltage VBL that is applied to the bit line BL by judging the number of programmed memory cells MC per 1 block.

For example, the erase operation is a long operation compared to the read operation in accordance with the read command. Therefore, in the erase operation, even if the information is read from all of the memory cells MC of one block, the time necessary for the erase operation is not extremely long.

While the first to third embodiments have been described, and the semiconductor device 200 may include all of the first to third embodiments, this is not limited thereto. It is sufficient for the semiconductor device 200 to include the entire embodiment of at least one of the first to third embodiments.

Thus, according to the embodiments, a semiconductor device in which it is possible to suppress the fluctuation of the cell current can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:

a memory cell array, the memory cell array including a plurality of memory strings, the plurality of memory strings including a plurality of memory cells connected in series, each of the plurality of memory cells storing information according to a threshold voltage;

a plurality of word lines, each word line being connected to a gate electrode of the plurality of memory cells, the plurality of memory cells connected to one of the word lines being included in a unit of a page;

a plurality of bit lines, each bit line being connected to one end of the plurality of memory strings;

a source line being connected to one other end of the plurality of memory strings; and a circuit controlling a read operation of the information, applying a pre-charge voltage to the plurality of bit lines in the read operation and changing the pre-charge voltage according to at least one of a number of used pages, or a position of the page.

2. The semiconductor device according to claim 1, wherein the circuit changes a value of the pre-charge voltage according to the number of used pages when the read operation is in accordance with a read command or when the read operation is in accordance with an erase verify operation.

3. The semiconductor device according to claim 2, wherein the circuit sets a value of the pre-charge voltage to a first value in the case where the number of used pages is large, and the circuit sets the value of the pre-charge voltage to a second value less than the first value in the case where the number of used pages is small.

4. The semiconductor device according to claim 2, wherein the circuit sets the value of the pre-charge voltage to be lower as the number of used pages decreases.

5. The semiconductor device according to claim 1, wherein the circuit changes a value of the pre-charge voltage according to the position of the page when the read operation is in accordance with a program verify operation.

6. The semiconductor device according to claim 5, wherein the circuit sets the value of the pre-charge voltage to a third value in the case where the position of the page is proximal to the source line, and the circuit sets the value of the pre-charge voltage to a fourth value higher than the third value in the case where the position of the page is distal to the source line.

7. The semiconductor device according to claim 5, wherein the circuit sets the value of the pre-charge voltage to be higher as the page approaches the bit line from the source line.

8. The semiconductor device according to claim 1, wherein the circuit sets the value of the pre-charge voltage to a fifth value in the case where the number of programmed memory cells is large, and the circuit sets the value of the pre-charge voltage to a sixth value less than the fifth value in the case where the number of programmed memory cells is small.

9. The semiconductor device according to claim 1, wherein the circuit sets the value of the pre-charge voltage to be lower as the number of programmed memory cells decreases.

10. The semiconductor device according to claim 1, wherein the page includes a data area and a flag area, and information indicating the number of used pages is recorded in the flag area.

11. The semiconductor device according to claim 10, wherein the information indicating the number of used pages is recorded in a page most proximal to the source line.

12. The semiconductor device according to claim 1, wherein the pages include a page usable by a user, and a page unusable by the user, and information showing the number of used pages is recorded in the page unusable by the user.

13. The semiconductor device according to claim 12, wherein the page unusable by the user is more proximal to the source line than is the page usable by the user.

14. The semiconductor device according to claim 13, wherein the page unusable by the user includes a dummy word line.

15. The semiconductor device according to claim 1, wherein the position of the page is judged from a page address.

16. The semiconductor device according to claim 1, wherein the plurality of pages and the plurality of memory strings are included in a unit of a block, and the number of programmed memory cells is a number of programmed memory cells inside the block.

17. The semiconductor device according to claim 16, wherein the number of programmed memory cells inside the block is judged by reading information from all of the memory cells inside the block prior to performing the read operation.

18. The semiconductor device according to claim 17, wherein the information is erased from all of the memory cells inside the block after the information is read from all of the memory cells inside the block.

19. A method for operating a semiconductor device, the semiconductor device including:

a memory cell array, the memory cell array including a plurality of memory strings, the plurality of memory strings including a plurality of memory cells connected in series, each of the plurality of memory cells storing information according to a threshold voltage;

a plurality of word lines, each word line being connected to a gate electrode of the plurality of memory cells, the plurality of memory cells connected to one of the word lines being included in a unit of a page;

a plurality of bit lines, each bit line being connected to one end of the plurality of memory strings; and a source line being connected to one other end of the plurality of memory strings, the method comprising:

when reading the information of the memory cell:

judging at least one of a number of used pages, or a position of the page; and changing a pre-charge voltage according to at least one of the number of used pages, or the position of the page, the pre-charge voltage being applied to the plurality of bit lines.

* * * * *